US006566887B2

(12) United States Patent
Smith et al.

(10) Patent No.: US 6,566,887 B2
(45) Date of Patent: May 20, 2003

(54) METHOD AND DEVICE FOR DETECTING AND LOCATING INSULATION/ISOLATION DEFECTS BETWEEN CONDUCTORS

(75) Inventors: Paul Samuel Smith, West Valley, UT (US); Marlin Carl Shelley, Bountiful, UT (US); Jon Alan Bertrand, Taylorsville, UT (US)

(73) Assignee: Cirris Systems Corporation, Salt Lake City, UT (US)

( * ) Notice: Subject to any disclaimer, the term of this patent is extended or adjusted under 35 U.S.C. 154(b) by 0 days.

(21) Appl. No.: 09/873,833

(22) Filed: Jun. 4, 2001

(65) Prior Publication Data

US 2001/0054902 A1 Dec. 27, 2001

Related U.S. Application Data

(60) Provisional application No. 60/209,951, filed on Jun. 7, 2000.

(51) Int. Cl.[7] .............................................. G01R 31/08
(52) U.S. Cl. ............................ 324/514; 324/544; 174/8
(58) Field of Search .................................. 324/541, 547, 324/557, 514, 544; 340/644, 647, 551, 552; 174/8–26

(56) References Cited

U.S. PATENT DOCUMENTS

| 1,724,565 A | 8/1929 | Dana |
| 2,478,414 A | 8/1949 | Michal .................. 174/183 |
| 3,096,478 A | 7/1963 | Brown ..................... 324/54 |
| 3,263,165 A | 7/1966 | Eigen ...................... 324/54 |
| 3,370,227 A | 2/1968 | Bader et al. ............ 324/54 |
| 3,430,136 A | 2/1969 | Brustle et al. .......... 324/52 |
| 3,639,831 A | 2/1972 | Cushman ................. 324/33 |
| 3,694,587 A | * 9/1972 | Grandle, Jr. ......... 179/175.2 R |
| 3,857,091 A | 12/1974 | Kalifon ..................... 324/52 |
| 3,869,665 A | 3/1975 | Kenmochi et al. ....... 324/72 |
| 4,446,420 A | 5/1984 | Drouet ..................... 324/52 |
| 4,766,388 A | 8/1988 | Simmonds ............... 324/545 |
| 4,882,682 A | 11/1989 | Takasuka et al. ....... 364/507 |
| 4,891,597 A | 1/1990 | Asars ...................... 324/557 |
| 4,937,125 A | * 6/1990 | Sanmartin et al. ...... 428/116 |
| 4,967,149 A | * 10/1990 | Doemens et al. ....... 324/158 F |
| 5,124,687 A | 6/1992 | Okumura et al. ........ 340/647 |
| 5,365,177 A | 11/1994 | Hamp, III et al. ...... 324/547 |
| 6,063,997 A | 5/2000 | Endo et al. .............. 174/11 R |

* cited by examiner

*Primary Examiner*—Christine Oda
*Assistant Examiner*—Amy He
(74) *Attorney, Agent, or Firm*—Madson & Metcalf

(57) ABSTRACT

A system that finds breaches in solid insulation, as well as detecting insufficient air gaps between conductors. The invention solves problems in how to detect breaks in solid insulation by applying high voltages without damaging the solid insulation. The invention also overcomes limitations where the voltages required to detect an insufficient air-gap can cause damage to, or are difficult to apply to the electrical device under test. The system for testing conductors held physically separated or otherwise isolated from each other by an insulating material is composed of a high-voltage breakdown tester, a means of connecting the tester to the conductors, and an added gas that is used to displace air in the proximity of the conductors. Optionally additional conductors or probes are placed in proximity to the original conductors to: 1) find breaks in the solid insulation of one or more conductors, or 2) detect intended air-gaps or mechanical position in the DUT that have insufficient spacing to the additional conductors. The gas conducts current or arcs at a lower voltage gradient than air, which allows detection of insulation and isolation defects better and earlier than testing performed in ambient air conditions.

34 Claims, 4 Drawing Sheets

METHOD AND DEVICE FOR DETECTING AND LOCATING INSULATION/ISOLATION DEFECTS BETWEEN CONDUCTORS

RELATED APPLICATIONS

This application claims the benefit of earlier-filed U.S. Patent Application No. 60/209,951, filed Jun. 7, 2000, for "Method and Device for Detecting and Locating Insulation/Isolation Defects Between Conductors," which is incorporated herein by reference.

BACKGROUND OF THE INVENTION

1. Field of the Invention

The present invention relates generally to devices and methods used to detect defects in isolation and insulation in electrical wiring. More specifically, the present invention relates to devices and methods that detect defects in a specialized test gas environment.

2. Description of Related Art

Wires or cables typically have a conductor made from conductive material. Characteristically, conductive material is a class of material incapable of supporting electric stress, such that when a charge is given to a conductive material it spreads to all parts of the material. Exemplary conductive materials include aluminum, copper, platinum, gold, silver, chromium, tungsten, nickel, combinations thereof, and the like.

The conductors of wires are commonly coated with a solid insulating material primarily to provide electrical isolation between wires. In addition to its primary function, the solid insulation material also helps provide thermal insulation, strain relief, protection against mechanical damage and abrasion, chemical and corrosion protection, sealing, and limit signal distortion. The thickness and dielectric characteristics of this solid insulation are specifically chosen to maintain isolation, limit shock danger and signal distortion seen in the conductor. As wire is used for a wide variety of purposes, there are differences in the type of insulation used. For example, a data communication cable may use a Teflon® FEP coat to promote transmission and provide physical protection.

Occasionally the solid insulation surrounding conductive wires is damaged or defective. The damaged or defective solid insulation may expose the conductors. The damage or defects in the insulation may be very small and difficult to see. Defects, such as cracking, often results from mechanical stresses imposed upon conductors having brittle insulation. Embrittlement of the insulation is a result of the normal aging of the insulation. Aging is often accelerated by cable operation at high temperatures over an extended period of time. Mechanical stresses may be caused by short-circuit currents, thermal expansion and contraction of the conductors, movement of the conductor, and vibration. While the dielectric strength of insulation is not significantly reduced by brittleness alone, loss of isolation can result from the development of cracks. For this reason, close inspection of insulation should be made at frequent intervals, and repairs made as necessary.

More specifically, it is important to know if insulating material surrounding a conductive wire or cable has been pierced or broken. Such a defect could be a precursor to an electrical failure in the overall electrical system in which the wire or cable is installed. Similarly, isolated conductors, which are too close together, such as exposed pins in a connector or conductors in an automobile fuse box, may cause an electrical short circuit. Bent or damaged conductors may violate the air gap distances necessary to maintain isolation, thereby introducing a potential short circuit or flashover situation within the electrical system. Failures in the solid wire insulation or uncontrolled short-circuiting between exposed conductors have caused numerous accidents in aircraft and other vehicles. It is therefore desirable to find damaged insulation and verify conductor isolation before a failure occurs so that appropriate repairs can be made.

Unfortunately, the defect and fault detection methods presently available are counterproductive to the defect detection process. For example, high voltage is commonly used to find defects in solid insulation, but the voltage required to find these insulation defects is often higher than the voltage rating of the insulation. Thus the test itself can actually destroy or weaken the insulation and wiring being analyzed, thereby creating defects in the solid insulation. What is needed is a method of reducing the voltage required to detect defects and electrical isolation faults in the electrical pathways.

Furthermore, traditional high voltage testing methods may not be used for wiring located in fuel rich operational environments, such as near jet engines. Applying a high voltage in such an environment creates a substantial risk of combustion unless all of the fuel is removed prior to testing. Some testing methods, such as introducing an ion cloud without displacing the oxygen, actually increase the risk of a spark igniting the fuel.

Accordingly, what is needed is an improved technique for testing insulation and isolation defects in electrical wiring. In particular, the test should not compromise the integrity of the wiring being tested nor be the cause of additional damage to the wiring. Additionally, a method of testing wiring for defects in unstable environments, such as a fuel rich jet engine environment, without generating a substantial risk of combustion is needed.

SUMMARY OF THE INVENTION

The present invention provides a system and method of detecting breaches in solid insulation and detecting insufficient air gaps between conductors. The invention performs these detections in a specialized gas environment tailored for high voltage defect sensor applications. The present invention has been developed in response to the current state of the art, and in particular, in response to these and other problems and needs that have not been fully or completely solved by currently available sensor or electronic detection applications. The present invention reduces the amount of high voltage required to detect an insulation or isolation defect when performing a high-voltage breakdown test. These qualities are primarily accomplished through injection of a test gas into the area around the electrical pathway or conductor being tested. Exemplary test gases useful with the present invention include neon, helium, argon, xenon, krypton, radon, and combinations thereof. Helium, for example, has been shown to require a lower voltage gradient than air requires (e.g., at 1500 V and at atmospheric pressure, an arc occurs at approximately 0.009 short-inch in air versus 0.4 inch in helium), and is an excellent choice for the test gas.

The lower voltage gradient of an easily ionized test gas when compared to ambient air helps the system check the solid insulation around wires and cables at a lower voltage potential. The test gas is directed or confined such that it envelops the area to be tested. When high voltage is applied between conductors that are exposed and physically close, a corona forms or an arc occurs between the conductors through the test gas. A testing device may record electrical noise or a current surge between the conductors. Prior to arcing, the added test gas exhibits a very high electrical resistance. Once a sufficient voltage gradient is applied, the test gas "breaks down" or ionizes and has very low effective resistance. With the lower resistance it is easier for an electrical arc to form between the conductors. In an effort to promote this effect at a lower voltage, the voltage gradient for the breakdown of the test gas used in the present invention is substantially lower than for ambient air.

Several configurations are available to test the electrical isolation of the cables in a gas-enriched test environment. One configuration uses a gas-containment shroud to maintain the gas enriched test environment. The gas containment shroud may be flexible and conform to the curvature of the electrical cables. The gas containment shroud may also be transparent, thereby making visible any corona activity around the electrical cables.

A high voltage breakdown tester places sufficient voltage potential across the conductors to detect insufficient isolation or defective insulation. An alternative configuration introduces at least one conductive probe into the shroud environment. The probe is connected to a tester and moved along the conductors. A defect in the insulation is detected when current flow is detected because of an arc between the probe and the conductors being tested. The arc occurs at the location of a defect in the isolation or insulation of a conductor, specifically where the voltage potential between the probe and the exposed conductor overcomes the voltage gradient required for electrical breakdown of the test gas. The application of the test gas by a gas source to a localized region of the conductors enclosed by the gas containment shroud may also be synchronized with a current-sense module on the high voltage breakdown tester to locate an isolation or insulation fault.

Using the characteristics of the test gas, the present invention may also verify the air gaps or required distance between isolated conductors separated by air. Exemplary air gaps include the pins in a connector or exposed conductors in an automobile fuse box. In the present invention, when a pin in a connector is bent, the applied voltage will promote arcing between the closest pins alerting a monitoring test device of the potential short circuit between wires.

Additionally, the system may also be used in fuel rich environments with a substantially lower risk of explosion. As the injected test gas displaces oxygen in the testing area, less oxygen is available for combustion. At certain concentrations of gas there is insufficient oxygen for combustion to occur. The concentration of the test gas in the testing area may be controlled in part by a gas containment shroud, which restricts the movement of the test gas away from the testing area.

The present invention reduces the amount of high voltage required to detect an insulation or isolation defect. The present invention detects the location of insulation defects without damaging the conductor being tested. The present invention allows the safe application of a high-voltage breakdown test for air gaps and insulation defects in fuel rich environments. The present invention enhances the sensitivity of a high-voltage breakdown test with respect to air gaps between conductors in a localized region. As such, the present invention helps verify the required distance between isolated conductors separated by ambient air, such as the pins in a connector or exposed conductors in an automobile fuse box.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
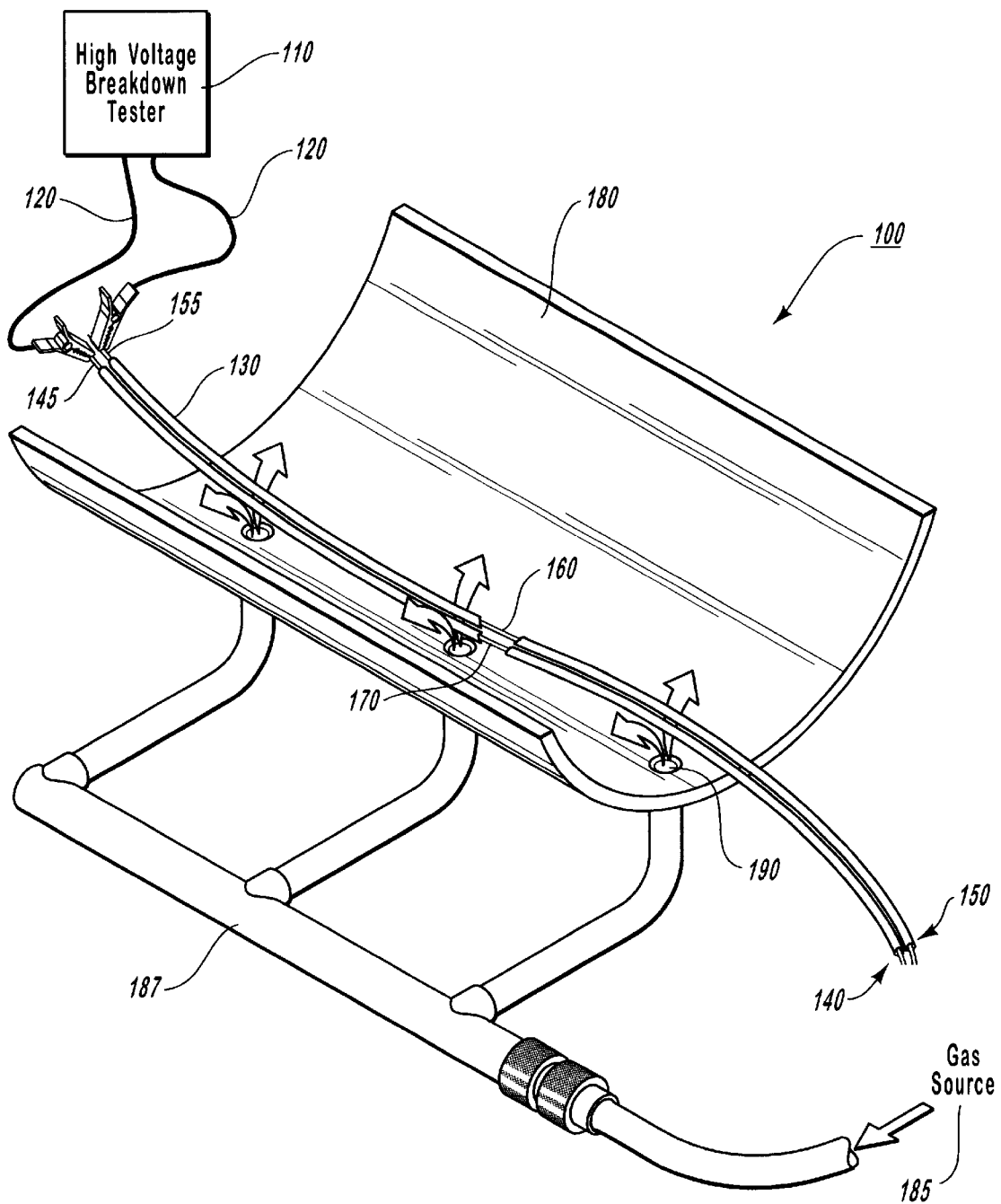
FIG. 1 illustrates one embodiment of a gas insulation and isolation defect detection system in accordance with the present invention.

The figures and the following discussion are intended to provide a brief, general description of a suitable operating environment in which the invention may be implemented. The figures are intended to be illustrative of potential systems that may utilize the present invention and is not to be construed as limiting. Those skilled in the art will appreciate that the invention may be practiced with many types of configurations, including electrical circuitry, wiring, cables, and the like.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments. In the following description, numerous specific details are provided, such as examples of test gases, various gas delivery and containment systems, different electrode probes, high voltage breakdown testers, types of insulation, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "gas" or "test gas" means a state of matter in which the molecules are practically unrestricted by cohesive forces and require a lower voltage gradient for ionization than ambient air requires. The test gases are referred to herein as electropositive. As such, the electropositive test gases exhibit an ionization point, breakdown, flashover, arcing, or corona discharge at a lower voltage gradient relative to ambient air. Exemplary test gases useful with the present invention include neon, helium, argon, xenon, krypton, radon, and combinations thereof either at atmospheric or reduced pressure. Helium, for example, has been shown to require a lower voltage gradient than air requires before causing a noticeable voltage event, such as arcing or corona discharge, and is an excellent choice for the test gas. Using 1500 Volts at atmospheric pressure to test for voltage events, an arc occurs at approximately 0.009 inch in air versus 0.4 inch in helium. Under these test conditions, an environment flooded with helium exhibits about $1/40^{th}$ the voltage gradient of the same environment flooded with air. The noble test gases listed above have the added benefit that they are generally not chemically combining even during an arc. Other electropositive gases, which may or may not chemically combine with conductors and/or insulation, may also be used.

"Ionization" is the process by which neutral atoms or groups of atoms become electrically charged, either positively or negatively, by the loss or gain of electrons. An "ionized test gas" denotes the state of the test gas when atoms or groups of atoms within the test gas have become charged. The test gases may initially be introduced into the test area in a non-ionized state, but the test gas still requires a lower inducing voltage than ambient air for the occurrence of a noticeable voltage event, such as arcing or corona discharge.

Reference throughout this specification to "cable" or "wire" means a conductor or bundle of conductors with or without insulation. Conductors are made from electrically conductive material. Characteristically, conductive material is a class of material incapable of supporting electric stress, such that when a charge is given to a conductive material it spreads to all parts of the material. Exemplary conductive materials include aluminum, copper, platinum, gold, silver, chromium, tungsten, nickel, combinations thereof, and the like.

Reference is first made to FIG. 1 illustrating an isolation defect detection system 100 or environment in which the present invention may be utilized or implemented. The system 100 includes a high-voltage breakdown tester 110 connected via wires 120 to test the integrity of the solid insulation 130 of the wires 140, 150. The high-voltage breakdown tester 110 also tests the isolation of the electrical paths created by conductors 145, 155 for electrical signals. Exemplary conductors or electrical paths that may be tested by the present invention include cables, connectors, wire harness, backplanes, printed circuit boards, circuitry, or other similar electrical apparatus. While FIG. 1 only illustrates two wires 140, 150, one skilled in the relevant art will recognize, however, that the system may also be practiced with multiple conductors.

As previously mentioned, the conductors 145 and 155 generally include at least one coating of solid insulation 130 to prevent arcing between neighboring conductors. Insulation applied directly over conductors 145 and 155 is often called the primary insulation, since it determines most of the transmission properties of an individual conductor. Sheath insulation, commonly called the jacket, brings several conductors together in a single cable configuration. The sheath insulation predominately offers mechanical protection. However, it does affect the electrical performance of the cable. Exemplary insulation materials used in data communication cables include FHF film (Teflon® FEP), Halar ECTFE, Compounded PVC, and other polymer resins. Other insulation systems for conductors include impregnated fiber products, laminated and molded products, polyester film, polyamide film, adhesive tapes, composite products, insulating paper, mica products, fiberglass sleeving, fiberglass tape, polyester non-woven fabrics, thermoplastic systems (asphalt-mica), thermosetting systems (polyester-mica or epoxy-mica), and other compounds know to one of skill in the art.

During testing, high voltage is applied between the conductors 145, 155 via wires 120 electrically attached to the high-voltage breakdown tester 110. In one embodiment of the present invention, the high voltage breakdown tester 110 further includes a high voltage supply and a current-sense module. The tester 110 is used to determine the amount of electrical isolation between conductors 145 and 155. The high voltage breakdown tester 110 performs a "hipot test" by applying a high voltage (AC or DC) potential between conductors 145 and 155 and sensing the current flow (AC or DC). The high voltage supply may provide between about 50 Volts and about 15,000 Volts. More preferably, the high voltage supply at atmospheric pressure provides between about 150 Volts and about 3000 Volts. The amount of current sensed or the current change over time is used to determine the quality of insulation or isolation between conductors 145 and 155. If multiple conductors are being tested for insulation/isolation, patterns may be used to apply the voltage between conductors such that all conductors to be tested for insulation/isolation defects have voltage applied between them at some time during the test.

In the presence of a test gas, the high-voltage breakdown tester 110 senses the current flow that identifies arcs or faults between exposed conductors 160 and 170. The test gas is emitted into a gas containment shroud 180. The application of the test gas by a gas source to a localized region of the conductors enclosed by the gas containment shroud 180 may be synchronized with the current-sense module to locate an isolation or insulation fault.

In one embodiment, gas emission into the shroud 180 is delivered from a gas source 185 via a manifold 187 to at least one orifice 190. As the test gas enters the shroud 180 via the orifices 190, the test gas envelops a test area adjacent the conductors to be tested. In the presence of the test gas supplied by the gas source 185, the voltage potential required for current flow is substantially less than ambient air. Accordingly, one advantage of the present invention is the reduction of the amount of high voltage required to detect an insulation or isolation defect when performing a high-voltage breakdown test.

The system 100 retains the gas in the vicinity of the wires 140 and 150 via the gas containment shroud 180. Many devices can be used as a gas containment shroud 180 to constrain the concentration of the added gas, such as a container, box, bag, pillow, jet, rigid metallic form or guide, basin, flexible pipe, membrane, semi porous urethane barrier, balloon, sealed room, chassis, conductive fabric, and the like. These devices may or may not be used as part of the system 100 to emit the test gas. In the embodiment of FIG. 1, the test gas is directed towards the shroud 180 via the manifold 187 leading from the gas source 185. The test gas is dispersed within the shroud 180 via multiple orifices 190. The orifices 190 are preferably located in the vicinity of the desired test area. In one configuration the gas source 185 supplies the test gas under pressure, allowing the test gas to saturate the test area quickly. As the test gas expands under normal atmospheric conditions a high concentration of test gas molecules displace the ambient air.

The system 100 uses test gases that are electropositive, enabling voltage events, such as corona discharge or arcing, to be observed at lower voltage levels than ambient air. Preferably, these voltage levels are within the voltage rating of the insulation being tested. However, any lower voltage potential reduces risk of damage to the conductive wire and its insulation. The test gas exhibits a very high electrical resistance until the tester 110 applies a sufficient voltage gradient across the conductors 145 and 155.

Once a sufficient voltage gradient is applied, the test gas "breaks down" or ionizes and has very low effective resistance. With the lower resistance it is easier for an electrical arc to form between the exposed conductors 160 and 170. In an effort to promote this flashover effect at a lower voltage, the voltage gradient for the breakdown of the test gas used in the present invention is substantially lower than for ambient air. Exemplary gases useful with the present invention include neon, helium, argon, xenon, krypton, radon, and combinations thereof.

Lower voltages can be used to find insulation/isolation defects with the test gas than without the test gas. Alternatively, the same voltage applied with a test gas can sense greater gaps than without the gas. This process can be applied equally to new conductors or conductors that are installed into their final application such as installed wiring in an aging aircraft. Since an arc is most likely to occur in the region of the gas, the gas may be applied to all or part of the conductor to locate specific defects.

Figure 2:
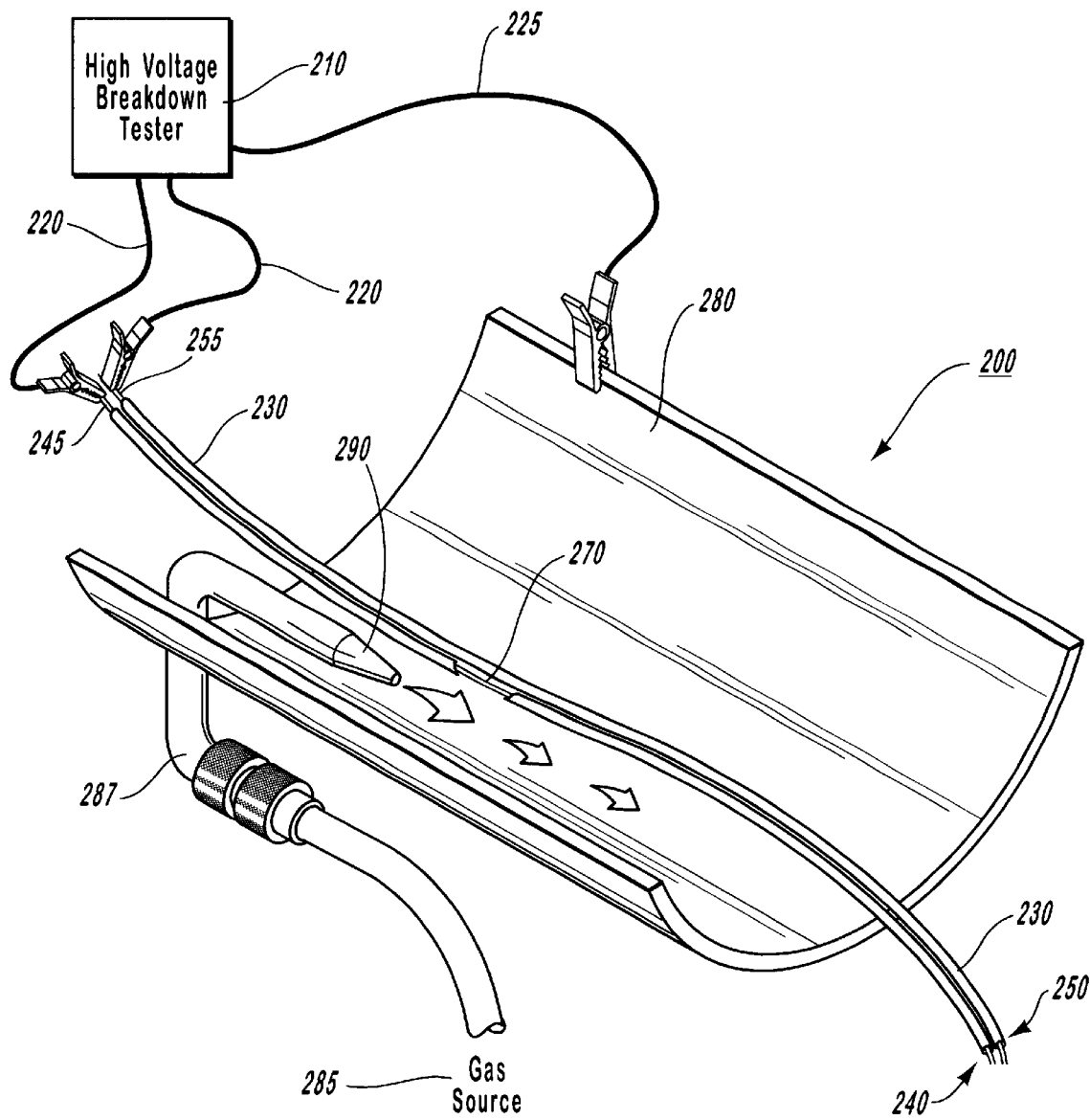
FIG. 2 illustrates an alternative embodiment of a gas insulation detection system with a conductive gas containment shroud.

Reference is next made to FIG. 2, an isolation defect detection system 200 that uses a conductive gas containment shroud 280 to help identify insulation defects and isolation faults in conductors is shown. The system 200 includes a high-voltage breakdown tester 210 connected via wires 220 to the cables 240, 250 to be tested. The high-voltage breakdown tester 210 is also connected via wire 225 to the conductive gas containment shroud 280. The cables 240, 250 include conductive core materials 245 and 255 each covered substantially by solid insulation 230. High voltage is applied between the conductors 245 and 255 and the conductive gas containment shroud 280 via wires 220 and 225 attached to the high-voltage breakdown tester 210. This configuration is useful when singular insulation defects need to be detected, as the exposed conductor 270 will arc to the conductive gas containment shroud 280.

An electropositive test gas is emitted into the conductive gas containment shroud 280 through jet 290 from a gas source 285 via a manifold 287. The test gas envelops the area surrounding the conductors to be tested and also contacts the conductive gas containment shroud 280. The jet 290 concentrates the level of the test gas in the test area. In the presence of the test gas, a high voltage arc occurs between exposed conductor 270 and the conductive shroud 280. Sensing the current flow in wires 220 and 225 from the arc, the high-voltage breakdown tester 210 identifies the fault. The accuracy of this testing procedure may be improved by synchronizing the release of the test gas with the application of the inducing voltage to the test area.

An alternative embodiment utilizes a manifold design similar to that illustrated in FIG. 1. The manifold allows the test gas to enter the conductive shroud through multiple openings. One skilled in the relevant art will also recognize, however, that many different gas distribution systems are known in the art and may be used without departing substantially from the invention. For example, the invention may also be practiced using multiple jets or inlets.

As previously mentioned, the test gas is electropositive, such as neon, helium, argon, xenon, krypton, radon, and combinations thereof. These gases do not need to be ionized prior to introduction into the test area. Furthermore, the system 200 does not require the use of a conductive ion stream or cloud, nor is an external ion generator necessary. Specifically, the test gas exhibits a very high electrical resistance until the tester 210 applies a sufficient voltage gradient across the wires 220 and 225. If a defect exists in the electrical system being tested, the gas "breaks down" or ionizes around the defect and has very low effective resistance once a sufficient voltage gradient is applied. With the lower resistance it is easier for an electrical arc to form between the exposed conductor 270 and the conductive shroud 280. As previously mentioned, to promote arcing at a lower voltage, the voltage gradient for the breakdown of the test gas used in the system 200 is substantially lower than for ambient air.

Figure 3:
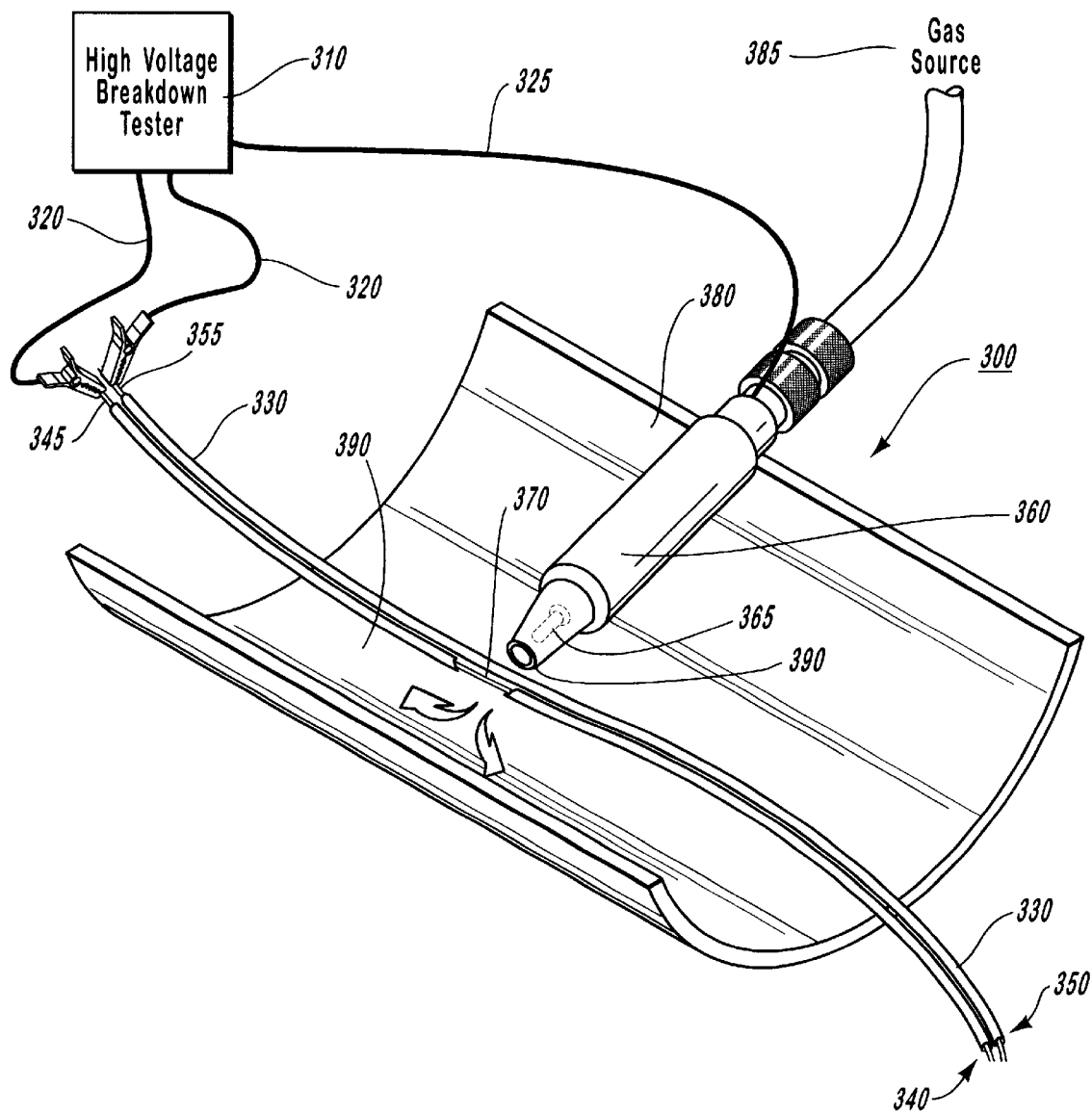
FIG. 3 illustrates a probe for use with an embodiment of the insulation detection system.

FIG. 3 is an insulation defect detection system 300 that uses a probe 360 to find insulation/isolation faults. The defect detection system 300 includes a high voltage breakdown tester 310 electrically connected via wires 320 to cables 340 and 350. More specifically, the tester 310 is electrically connected to the conductors 345 and 355. The tester 310 is also electrically connected via wire 325 to a probe 360. During testing, the probe 360 is brought near cables 340 and 350 and used in conjunction with the test gas to detect the exposed conductor 370. The system 300 also includes a gas containment shroud 380 to retain the gas introduced for testing.

The probe 360 includes both an external electrode/conductor and a mechanism for introducing the test gas into the test area. The external conductor, such as probe tip 365, is typically concealed within a gas nozzle or jet 390 to ensure isolation and reduce the risk of accidental contact with the probe tip 365 during the high voltages tests. The probe 360 is designed to deliver gas to the test area through the jet 390. As such, the test gas concentration is localized to the vicinity of the test probe 360. The jet 390 is supplied gas via the manifold 387 from the gas source 385. The probe 360 may improve overall test efficiency and reduce the amount of gas necessary to detect the exposed conductor 370 by synchronizing the release of the gas with the initiation of electrical testing. By combining gas delivery and detection functions into the probe 360, the system 300 is even more effective at finding insulation/isolation faults using the high voltage breakdown test.

In one embodiment, the gas is delivered using a gas delivery system separate from the probe as illustrated in FIGS. 1 and 2. In this configuration, the probe is introduced into the test environment after the gas has saturated the test area. An alternative system configuration employs a conductive shroud as illustrated in FIG. 2 with the probe. An alternative configuration uses the manifold and multiple orifice shroud illustrated in FIG. 1.

The probe 360 increases the sensitivity of a hipot test to the insulation/isolation characteristics of a cable assembly by bringing an exposed conductive electrode 365 within the probe 360 close to the defect in solid insulation 330. Specifically, the high voltage breakdown tester 310 detects current flow between wires 320 and 325 as the probe 360 approaches the exposed conductor 370. Using the probe 360 further decreases the voltage needed in the test gas to find an insulation/isolation fault.

Additionally, the system 300 may also be used in fuel rich environments with a substantially lower risk of explosion. As the injected gas displaces oxygen in the testing area, less oxygen is available for combustion. At certain concentrations of test gas there is insufficient oxygen for combustion to occur. The concentration of the test gas in the testing area may be controlled in part by the gas containment shroud 380, which restricts the movement of the gas away from the testing area. The lower voltage requirement of the probe configuration improves the overall safety factor of the test in fuel rich environments.

Figure 4:
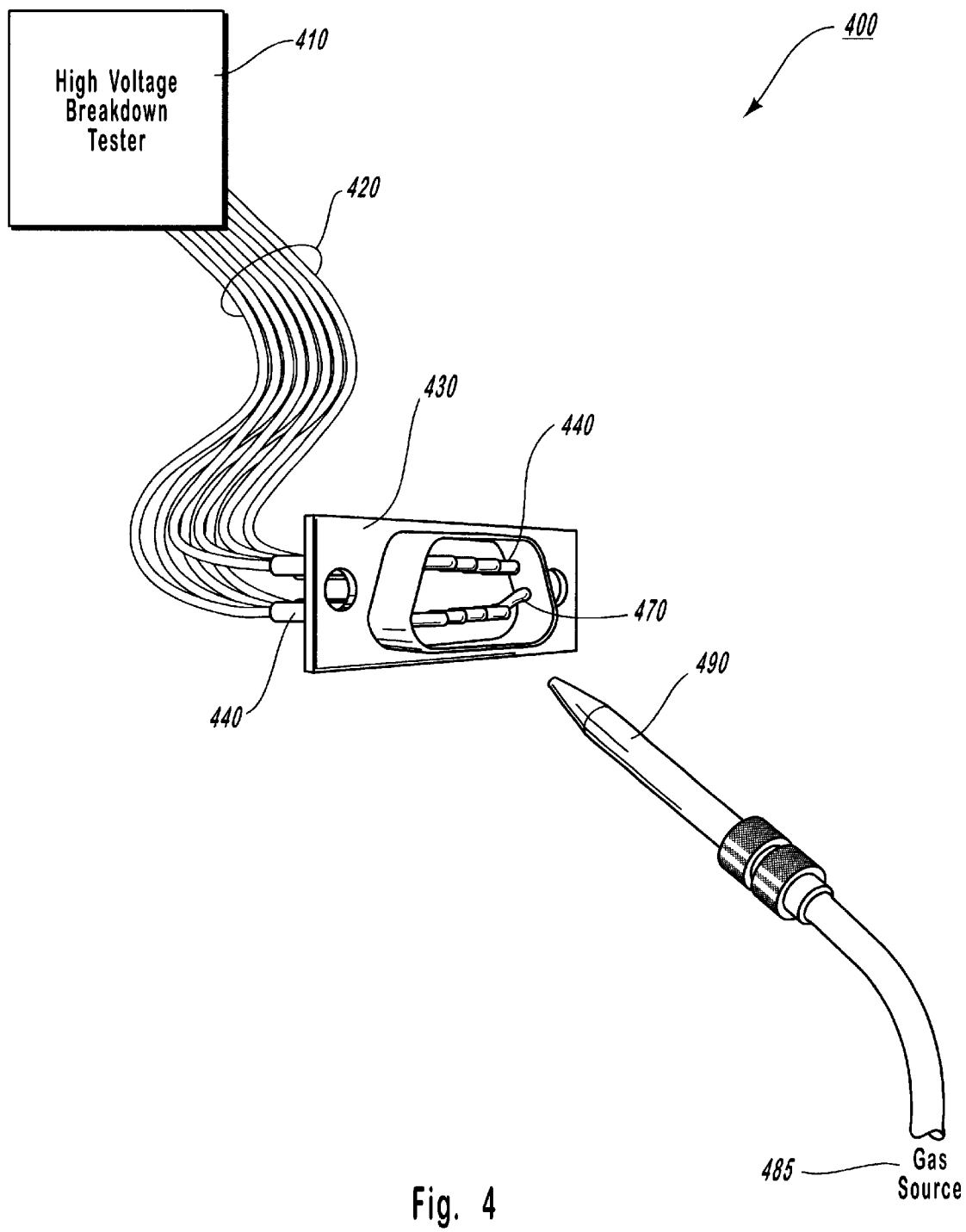
FIG. 4 illustrates an isolation defect detection system for monitoring conductors in a connector.

The present invention enhances the sensitivity of a high-voltage breakdown test to air gaps between conductors in a localized region. FIG. 4 illustrates a localized air gap detection system 400 used to test conductive pins 440 of a connector 430 for positional faults. A high-voltage breakdown tester 410 is connected to the conductive pins 440 of the connector 430 via wires 420. A gas source 485 may supply a test gas to displace the air in the vicinity of the connector 430. In one embodiment, the test gas supplied by the gas source 485 is non-ionized. The test gas emits from a nozzle 490 onto the test area to reduce the voltage potential necessary to detect mechanical position errors of the conductive pins 440. The emission of the test gas from the nozzle 490 may be synchronized with the high-voltage breakdown tester 410 so that the gas is present before the inducing voltage is applied. The conductive pins 440 are selectively connected to the high-voltage breakdown tester 410. If multiple conductive pins 440 are being tested for insulation/isolation, patterns may be used to apply the voltage between pins 440 such that all pins 440 to be tested for insulation/isolation defects have voltage applied between them at some time during the test. When the high voltage breakdown tester 410 applies the necessary voltage potential to the conductive pins 440, bent pin 470 will arc through the gas to one of the adjacent conductive pins 440. The high-voltage breakdown tester 410 detects the arc by the current flow. An effective way of testing the connector is to synchronize the release of the test gas with the application of the inducing voltage to the various conductive pins 440.

Using the characteristics of the test gas, the system 400 may also verify the air gaps or required distance between isolated conductors. Exemplary air gaps include the pins 440 in a connector 430 or exposed conductors in an automobile fuse box. Often small variations in pin positioning are imperceptible and would be difficult to detect without system 400. In the illustrated example, the positional error of the bent pin 470 violates the isolation standards for the connector 430 and could short circuit during use, not to mention the substantial risk of misconnection.

Another embodiment places multiple conductive probes close to the conductors being tested, each probe being attached to the high-voltage breakdown tester to detect isolated insulation failures. With high-voltage applied to the conductors and additional probes, the gas will breakdown (arc) where the probes are in close proximity to the defect. The increased current sensed by the high-voltage breakdown tester will indicate that a fault has occurred. In this way, the high-voltage breakdown tester can be used to identify which conductors failed, and the gas and/or additional probes may optionally be localized and traversed along the conductors to identify the specific location of the fault.

In summary, the present invention reduces the amount of high voltage required to detect an insulation or isolation defect by introducing a test gas into the test area. By reducing the voltage necessary, the present invention may detect the location of insulation defects without damaging the conductor being tested. The present invention also allows the safe application of a high-voltage breakdown test for air gaps and insulation defects in fuel rich environments. The present invention enhances the sensitivity of a high-voltage breakdown test with respect to air gaps between conductors in a localized region. As such, the present invention helps verify the required distance between isolated conductors separated by ambient air, such as the pins in a connector or exposed conductors in an automobile fuse box.

What is claimed and desired to be secured by United States Letters Patent is:

1. A process of detecting electrical defects in electrical insulation by causing arcing or corona through defects in the insulation surrounding at least one conductor in a conductive environment, the process comprising:

connecting conductors electrically to a tester that introduces an inducing voltage and senses current flow;

introducing an electropositive, noble gas to a test area adjacent the conductors, wherein the gas has a high electrical resistance similar to non-ionized air at atmospheric pressure, wherein the gas displaces the oxygen in the test area;

the tester generating an inducing voltage that is sufficient to ionize the test gas at atmospheric pressure but that is insufficient to ionize air at atmospheric pressure;

applying the inducing voltage to the conductors at atmospheric pressure; and monitoring current flow for the purpose of detecting an isolation defect in the test area.

2. The process as recited in claim 1, wherein the isolation defect is an insulation defect.

3. The process as recited in claim 1, wherein the tester is a high-voltage breakdown tester that applies a high voltage potential between the conductors to determine the quality of isolation between the conductors.

4. The process as recited in claim 1, further comprising introducing into the test area a conductive probe that enables voltage events between the conductors and the probe, the probe being electrically connected to the tester.

5. The process as recited in claim 4, wherein the tester is a high-voltage breakdown tester that applies a high voltage potential between the conductors and the probe to determine the quality of isolation of the conductors.

6. The process as recited in claim 5, wherein the step of introducing the gas increases the sensitivity of a high-voltage breakdown test performed by the tester to air gaps between conductors.

7. The process as recited in claim 5, wherein the tester senses current flow in at least one conductor.

8. The process as recited in claim 5, further comprising determining the quality of insulation surrounding the conductors.

9. A system for detecting electrical defects in electrical insulation, the system comprising:

a tester electrically connectable to conductors to determine the amount of electrical isolation between conductors that are substantially covered by electrical insulation, the tester comprising a high voltage supply and a current-sense module, wherein the high voltage supply generates a voltage that is sufficient to ionize a noble test gas at atmospheric pressure but that is insufficient to ionize air at atmospheric pressure; and a gas distribution system to direct the noble test gas into a test area adjacent the conductors at atmospheric pressure, wherein the test gas has a high electrical resistance similar to non-ionized air at atmospheric pressure, wherein the test gas displaces the oxygen in the test area, and wherein the test gas enables arcing between exposed conductors in physical proximity at a lower voltage than would be required in ambient conditions.

10. The system as recited in claim 9, wherein the test gas has a high electrical resistance similar to non-ionized air until a sufficient applied voltage gradient ionizes the test gas so that the test gas exhibits a low effective resistance less than $10^9$ Ohms per inch.

11. The system as recited in claim 9, wherein the tester is a high voltage breakdown tester.

12. The system as recited in claim 9, wherein at least one isolated electrical path is selected by the tester for testing, the electrical path being selected from the conductors group consisting of cables, connectors, wire harness, backplane, printed circuit board, other electrical apparatus, and combinations thereof.

13. The system as recited in claim 9, the gas distribution system further comprising:
   a gas source for supplying the test gas;
   a manifold for delivering the test gas to the electrical vicinity of the conductors, the manifold being in communication with the gas source; and
   a gas containment shroud for retaining a portion of the test gas supplied by the gas source in the electrical vicinity of the conductors.

14. The system as recited in claim 13, wherein the application of gas by the gas source to a localized region of the conductors enclosed by the gas containment shroud is synchronized with the current-sense module to locate an isolation or insulation fault.

15. The system as recited in claim 13, wherein the tester further comprises at least one conductive probe introduced into the shroud to detect insufficient isolation or defective insulation of the conductors being tested.

16. The system as recited in claim 13, wherein the gas containment shroud is conductive.

17. The system as recited in claim 16, wherein the gas containment shroud is electrically connected to the tester.

18. The system as recited in claim 13, wherein the gas containment shroud is transparent, thereby making visible any corona activity around the electrical conductors.

19. The system as recited in claim 13, wherein the gas containment shroud is flexible and conforms to the curvature of said conductors.

20. The system as recited in claim 13, wherein the gas containment shroud is semi-sealed.

21. The system as recited in claim 13, wherein the gas distribution system further comprises at least one nozzle for delivering the gas within the gas containment shroud.

22. The system as recited in claim 13, wherein the gas distribution system further comprises at least one orifice for delivering the gas within the gas containment shroud.

23. The system as recited in claim 13, wherein the gas distribution system further comprises at least one jet for quickly delivering high concentrations of the gas within the shroud.

24. The system as recited in claim 13, wherein the gas is under low pressure around the electrical insulation.

25. A method of testing isolation within an electrical system, wherein the system to be evaluated includes one or more electrical paths for conducting electrical signals, the method comprising:
   displacing air around the system with an electropositive, noble test gas, wherein the test gas has a high electrical resistance similar to non-ionized air at atmospheric pressure;
   introducing an ionization voltage in the electrical paths at atmospheric pressure after the test gas has been introduced to the system, wherein the ionization voltage is sufficient to ionize the test gas at atmospheric pressure but is insufficient to ionize air at atmospheric pressure; and
   detecting isolation defects within the system by detecting voltage events associated with at least one electrical path within the system.

26. The method as recited in claim 25, wherein the ionization voltage is between about 50 Volts and about 15,000 Volts.

27. The method as recited in claim 25, further comprising introducing an electrically conductive probe adjacent the system, the probe applying a high voltage potential between the electrical paths and the probe.

28. The method as recited in claim 27, wherein introducing an ionization voltage further comprises using a high-voltage breakdown tester to apply a high voltage potential between electrical paths.

29. The method as recited in claim 28, wherein detecting isolation defects within the system further comprises monitoring the amount of current detected and the change in current over time to determine the quality of isolation between electrical paths within the system.

30. The method as recited in claim 29, wherein an electropositive gas is introduced through an orifice within the electrically conductive probe.

31. A system for detecting defects in electrical insulation, the system comprising:
   a gas source for introducing an electropositive, noble test gas to a test area that comprises at least two adjacent conductors that are installed into their final application, wherein the at least two adjacent conductors are substantially covered by electrical insulation, wherein the test gas has a high electrical resistance similar to non-ionized air at atmospheric pressure;
   a gas containment shroud that at least partially envelops the test area, the gas containment shroud comprising a plurality of orifices that are located in the vicinity of the test area;
   a manifold for delivering the test gas from the gas source to the plurality of orifices; and
   a tester comprising a voltage supply and a current-sense module, wherein the tester is electrically connectable to the at least two conductors, wherein the voltage supply applies a voltage to the at least two conductors at atmospheric pressure after the test gas is introduced into the test area, wherein the voltage is sufficient to ionize the test gas but is insufficient to ionize air at atmospheric pressure, and wherein the current-sense module senses current flow between the at least two conductors caused by a defect in the electrical insulation.

32. A system for detecting defects in electrical insulation, the system comprising:
   a gas source for introducing an electropositive, noble test gas to a test area that comprises at least one conductor that is installed into its final application, wherein the at least one conductor is substantially covered by electrical insulation, wherein the test gas has a high electrical resistance similar to non-ionized air at atmospheric pressure;
   a conductive gas containment shroud that at least partially envelops the test area;
   a nozzle for emitting the test gas, the nozzle being movable to the vicinity of the test area;
   a manifold for delivering the test gas from the gas source to the nozzle; and
   a tester comprising a voltage supply and a current-sense module, wherein the tester is electrically connectable to the at least one conductor and to the conductive gas containment shroud, wherein the voltage supply applies a voltage to the at least one conductor and the conductive gas containment shroud at atmospheric pressure after the test gas is introduced into the test area, wherein the voltage is sufficient to ionize the test gas at atmospheric pressure but is insufficient to ionize air at atmospheric pressure, and wherein the current-sense module senses current flow between the at least one conductor and the gas containment shroud caused by a defect in the electrical insulation.

33. A system for detecting defects in electrical insulation, the system comprising:

a gas source for introducing an electropositive, noble test gas to a test area that comprises at least one conductor that is installed into its final application, wherein the at least one conductor is substantially covered by electrical insulation, wherein the test gas has a high electrical resistance similar to non-ionized air at atmospheric pressure;

a gas containment shroud that at least partially envelops the test area;

a probe that is movable to the vicinity of the test area, the probe comprising an electrode and a nozzle for emitting the test gas;

a manifold for delivering the test gas from the gas source to the nozzle; and a tester comprising a voltage supply and a current-sense module, wherein the tester is electrically connectable to the at least one conductor and to the electrode, wherein the voltage supply applies a voltage to the at least one conductor and the electrode at atmospheric pressure after the test gas is introduced into the test area, wherein the voltage is sufficient to ionize the test gas at atmospheric pressure but is insufficient to ionize air at atmospheric pressure, and wherein the current-sense module senses current flow between the at least one conductor and the electrode caused by a defect in the electrical insulation.

34. A system for detecting defects in electrical insulation, the system comprising:

a gas source for introducing an electropositive, noble test gas to a test area that comprises a plurality of conductive pins located on an electrical connector, wherein the test gas has a high electrical resistance similar to non-ionized air at atmospheric pressure;

a nozzle for emitting the test gas, the nozzle being movable to the vicinity of the plurality of conductive pins;

a manifold for delivering the test gas from the gas source to the nozzle; and a tester comprising a voltage supply and a current-sense module, wherein the tester is electrically connectable to the plurality of conductive pins, wherein the voltage supply applies a voltage to the plurality of conductive pins at atmospheric pressure after the test gas is introduced into the test area, wherein the voltage is sufficient to ionize the test gas at atmospheric pressure but is insufficient to ionize air at atmospheric pressure, and wherein the current-sense module senses current flow between the plurality of conductive pins caused by a positional defect.

* * * * *